(12) United States Patent
Teague (10) Patent No.: US 11,804,839 B1
(45) Date of Patent: Oct. 31, 2023

(54) INTEGRATED TRIGGER PHOTOCONDUCTIVE SEMICONDUCTOR SWITCH

(71) Applicant: Government of the United States, as represented by the Secretary of the Air Force, Kirtland AFB, NM (US)

(72) Inventor: Joseph Dana Teague, Tijeras, NM (US)

(73) Assignee: Government of the United States as represented by the Secretary of the Air Force, Kirtland AFB, NM (US)

( * ) Notice: Subject to any disclaimer, the term of this patent is extended or adjusted under 35 U.S.C. 154(b) by 125 days.

(21) Appl. No.: 16/774,918

(22) Filed: Jan. 28, 2020

(51) Int. Cl.
*H03K 17/78* (2006.01)
*H01L 31/16* (2006.01)
(Continued)

(52) U.S. Cl.
CPC ........... *H03K 17/78* (2013.01); *H01L 23/552* (2013.01); *H01L 31/0203* (2013.01);
(Continued)

(58) Field of Classification Search
CPC . H01L 31/1075; H01L 31/107; H01L 31/102; H01L 31/101; H01L 31/119; H01L 31/10; H01L 31/08; H01L 31/09; H01L 31/095; H01L 31/02327; H01L 27/14; H01L 27/144; H01L 27/1443; H01L 23/552; H01L 31/02005; H01L 31/0203;
(Continued)

(56) References Cited

U.S. PATENT DOCUMENTS

| | | | |
|---|---|---|---|
| 4,240,088 A * | 12/1980 | Myers | .................. H01L 31/105 327/365 |
| 4,822,991 A * | 4/1989 | Riggs | ..................... H03K 17/78 250/214 R |

(Continued)

FOREIGN PATENT DOCUMENTS

| | | |
|---|---|---|
| CN | 1877866 B | 7/2010 |
| CN | 102945887 A | 2/2013 |

(Continued)

OTHER PUBLICATIONS

Wang, L., et al., "Photoconductive semiconductor switch-based triggering with 1 ns jitter for trigatron," Matter and Radiation at Extremes, No. 3, Jun. 15, 2018, pp. 256-260.

(Continued)

*Primary Examiner* — John R Lee
(74) *Attorney, Agent, or Firm* — David L. Narciso; AFNWC/JA (57) ABSTRACT

A semiconductor device includes an optical source; a photoconductive switch triggered by the optical source; and an enclosure unit that contains the optical source and the photoconductive switch in a single integrated package. The optical source may output a laser. The optical source may be a diode. The enclosure unit may be conductive. The enclosure unit may be non-conductive. The device may include an electrical connector operatively connected to the optical source. The electrical connector may provide power and control signals to the optical source. The electrical connector may be attached to an outer surface of the enclosure unit.

25 Claims, 8 Drawing Sheets

(51) Int. Cl.
*H05K 9/00* (2006.01)
*H01L 23/552* (2006.01)
*H01L 31/02* (2006.01)
*H01L 31/0203* (2014.01)
*H01L 31/0304* (2006.01)

(52) U.S. Cl.
CPC ...... *H01L 31/02005* (2013.01); *H01L 31/162* (2013.01); *H05K 9/0058* (2013.01); *H01L 31/03042* (2013.01); *H01L 31/03044* (2013.01)

(58) Field of Classification Search
CPC ............ H01L 31/162; H01L 31/03042; H01L 31/03044; H03K 17/74; H03K 17/78; H04B 3/50; H05K 9/0058
See application file for complete search history.

(56) References Cited

U.S. PATENT DOCUMENTS

| | | | |
|---|---|---|---|
| 4,825,061 A * | 4/1989 | Schoenbach | H01L 31/02963 257/E31.093 |
| 5,146,075 A * | 9/1992 | Kim | G02B 6/4295 250/208.6 |
| 5,155,352 A | 10/1992 | Kim et al. | |
| 5,177,486 A | 1/1993 | Kim et al. | |
| 5,280,168 A | 1/1994 | Kim et al. | |
| 5,384,798 A | 1/1995 | Zucker et al. | |
| 5,419,329 A | 5/1995 | Smith et al. | |
| 5,450,430 A * | 9/1995 | Chung | H03K 17/78 372/38.03 |
| 5,574,464 A | 11/1996 | Madonna et al. | |
| 5,804,815 A | 9/1998 | Loubriel et al. | |
| 5,808,349 A | 9/1998 | Papadopoulos | |
| 6,248,992 B1 | 6/2001 | Baca et al. | |
| 6,483,094 B1 * | 11/2002 | Yahav | H01L 31/143 250/214 R |
| 7,173,295 B1 | 2/2007 | Mar et al. | |
| 8,655,125 B2 | 2/2014 | Sullivan et al. | |
| 9,025,919 B2 * | 5/2015 | Sullivan | G02F 1/0102 250/214 SW |
| 9,240,506 B2 | 1/2016 | Werne et al. | |
| 9,473,080 B1 | 10/2016 | Cripe et al. | |
| 9,513,212 B2 * | 12/2016 | Takenaka | G01N 21/3581 |
| 9,543,462 B2 | 1/2017 | Wang et al. | |
| 9,595,623 B1 | 3/2017 | Xie | |
| 9,900,203 B1 | 2/2018 | London et al. | |
| 10,094,978 B2 * | 10/2018 | Wu | H01Q 1/38 |
| 10,181,544 B2 * | 1/2019 | Nelson | H03K 17/78 |
| 10,403,780 B2 | 9/2019 | Jang | |
| 11,522,542 B2 * | 12/2022 | Voss | H01L 31/03125 |
| 2005/0116145 A1 * | 6/2005 | Aki | H01L 31/12 257/E23.114 |
| 2007/0292074 A1 * | 12/2007 | Mazzola | H01L 31/09 257/E31.093 |
| 2011/0133203 A1 | 6/2011 | Werne et al. | |
| 2011/0174960 A1 * | 7/2011 | Weaver | B82Y 30/00 250/214 SW |
| 2012/0098607 A1 | 4/2012 | Tatoian et al. | |
| 2012/0326036 A1 * | 12/2012 | Tomioka | G01J 3/10 250/338.1 |
| 2013/0334537 A1 * | 12/2013 | Helava | H01L 31/03044 257/431 |
| 2013/0342306 A1 * | 12/2013 | Sampayan | H01C 1/00 338/15 |
| 2014/0240510 A1 * | 8/2014 | Takenaka | H04N 5/33 348/162 |
| 2014/0264377 A1 | 9/2014 | Andingham et al. | |
| 2014/0264684 A1 | 9/2014 | Bhattacharya et al. | |
| 2016/0276518 A1 | 9/2016 | Wang et al. | |
| 2018/0013028 A1 * | 1/2018 | Nelson | H03K 17/78 |
| 2018/0053872 A1 | 2/2018 | Jang | |
| 2019/0108968 A1 | 4/2019 | Papeer et al. | |
| 2019/0131482 A1 * | 5/2019 | Conway | H03K 17/78 |
| 2020/0350910 A1 * | 11/2020 | Zegmout | H01L 31/08 |
| 2020/0382118 A1 * | 12/2020 | Voss | H01L 31/03042 |

FOREIGN PATENT DOCUMENTS

| | | |
|---|---|---|
| CN | 202977498 U | 6/2013 |
| CN | 203242917 U | 10/2013 |
| CN | 106169515 A | 11/2016 |
| CN | 107369705 A | 11/2017 |

OTHER PUBLICATIONS

Teague, J., "Characterization of Gallium Nitride Photoconductive Semiconductor Switches in the Nonlinear Regime," University of New Mexico, Department of Electrical and Computer Engineering ETDs, Thesis, Jul. 30, 2018, 70 pages.

Chu, X., et al., "Investigation of high-voltage pulse trigger generator based on photo-conductive semiconductor switch," AIP Advances 8, 065304, Jun. 5, 2018, 10 pages.

Pickrell, G., et al., "Advanced GaN Device Technologies for Power Electronics Applications," ECS Meeting Abstracts is an official publication of The Electrochemical Society, Abstract, vol. MA2018-02, No. 34, 1156, 4 pages.

Tian, L., et al., "Optical absorption mechanism of GaAs photoconductive semiconductor switch," Japanese Journal of Applied Physics 57, 080303, Jun. 29, 2018, 4 pages.

Xu, M., et al., "Transient Characteristics of Interdigitated GaAs Photoconductive Semiconductor Switch at 1-kHz Excitation," IEEE Electron Device Letters, vol. 40, Issue 7, May 13, 2019, pp. 1136-1138.

Majda-Zdancewicz, E., et al., "Current state of photoconductive semiconductor switch engineering," Opto-Electronics Review 26, Mar. 8, 2018, pp. 92-102.

Hirsch, E., et al., "MVDC / HVDC Power Conversion with Optically-Controlled GaN Switches," ARPA-E Innovation Summit held Mar. 13-15, 2018, National Harbor, MD, conference poster, 1 page.

Ren, W., et al., "LED-Triggered Photoconductive Semiconductor Switches for Nanosecond Pulse Generation," 2016 IEEE International Power Modulator and High Voltage Conference (IPMHVC), Jul. 6-9, 2016, San Francisco, CA, pp. 36-39.

Xu, M., et al., "Operation of Pulse-Charged Spark Gap Triggered by GaAs Photoconductive Semiconductor Switch," IEEE Transactions on Plasma Science, vol. 38, No. 10, Oct. 2010, pp. 2888-2893.

Taylor, Z., et al., "Resonant-optical-cavity photoconductive switch with 0.5% conversion efficiency and 1.0W peak power," Optics Letters, vol. 31, No. 11, Jun. 1, 2006, pp. 1729-1731.

* cited by examiner

INTEGRATED TRIGGER PHOTOCONDUCTIVE SEMICONDUCTOR SWITCH

GOVERNMENT INTEREST

The invention described herein may be manufactured and used by or for the Government of the United States for all government purposes without the payment of any royalty.

BACKGROUND

Field of the Invention

The embodiments herein generally relate to power electronics such as photoconductive switches, and more particularly to pulsed power devices and integrated electronic devices for photoconductive switches.

Background of the Invention

Conventional pulsed power switches are generally bulky and imprecise, possessing large amounts of time-domain jitter and uncertainty. Moreover, conventional spark gap switches are typically constrained from use in applications where compactness and precision are key due to their size, weight, and inherent lack of repeatability in shot-to-shot timing. While well understood and reliable, this limits their application in certain fields.

Furthermore, conventional transistors generally cannot handle the voltage or current requirements of high voltage DC/DC power conversion and isolation. Additionally, the conventional devices are generally limited in how fast they can switch on and off. This lower frequency operation necessitates large and expensive inductors, which are not desirable in small footprints settings and applications, and where lower cost options are required and advantageous.

BRIEF SUMMARY OF THE INVENTION

In view of the foregoing, an embodiment herein provides a semiconductor device comprising an optical source; a photoconductive switch triggered by the optical source; and an enclosure unit that contains the optical source and the photoconductive switch in a single integrated package. The optical source may output a laser. The optical source may comprise a diode. The enclosure unit may be conductive. The enclosure unit may be non-conductive. The device may further comprise an electrical connector operatively connected to the optical source, wherein the electrical connector provides power and control signals to the optical source. The electrical connector may be attached to an outer surface of the enclosure unit.

Another embodiment provides a semiconductor device comprising an optical source; an electrical connector to provide power and control signals to the optical source; a photoconductive switch actuated by photons directed by the optical source; and an enclosure unit that contains the optical source and the photoconductive switch in a single integrated package. The device may further comprise a shielding component that reduces electromagnetic interference between the optical source and the photoconductive switch. The shielding component may comprise any of copper, silver, gold, and aluminum. The photoconductive switch may operate in any of a linear and non-linear mode of operation upon actuation by the optical source. The photoconductive switch may alternate between the linear and non-linear mode of operation by altering a number of the photons directed by the optical source. The photoconductive switch may conduct electricity upon actuation by the optical source until a voltage level of the photoconductive switch drops below a threshold voltage level. The photoconductive switch may conduct electricity upon actuation by the optical source until the optical source is turned off.

Another embodiment provides a photonic system comprising an optical source that generates a light beam; a power source that provides electrical power to the optical source; a controller that sends control signals to the optical source to control transmission of the light beam; a photoconductive switch aligned with the optical source, wherein the photoconductive switch comprises semiconductor material that becomes optically triggered upon receiving the light beam from the optical source; a shielding component that controls electromagnetic interference between the optical source and the photoconductive switch; and an enclosure unit that houses the optical source, the photoconductive switch, and the shielding component in a single integrated package. The distance between the optical source and the photoconductive switch may be approximately one millimeter. The photoconductive switch may turn on and off based on the control signals that control the light beam. The frequency of the photoconductive switch turning on and off may be under one nanosecond. The frequency of the photoconductive switch turning on and off may be between 5-10 nanoseconds. The photoconductive switch may output an electromagnetic field upon the photoconductive switch being optically triggered.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF THE INVENTION

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

It will be understood that when an element or layer is referred to as being "on", "connected to", or "coupled to" another element or layer, it may be directly on, directly connected to, or directly coupled to the other element or layer, or intervening elements or layers may be present. In contrast, when an element or layer is referred to as being "directly on", "directly connected to", or "directly coupled to" another element or layer, there are no intervening elements or layers present. It will be understood that for the purposes of this disclosure, "at least one of X, Y, and Z" or "any of X, Y, and Z" may be construed as X only, Y only, Z only, or any combination of two or more items X, Y, and Z (e.g., XYZ, XY, XZ, YZ).

The embodiments herein provide a photoconductive semiconductor switch (PCSS) containing a semiconductor material, an optical triggering device, and the required mechanical and electrical connections to provide a high current, high voltage, ultra-short duration electrical pulse for devices that require it. The switch can be operated in either a linear, low-gain mode, turning on and off in sync with the optical trigger, or in a non-linear, high-gain mode, turning on with the optical trigger and remaining on until the voltage supply drops below a PCSS material dependent threshold. A single package device is provided containing the photoconductive switch, an optical source, and an assembly packaging to contain the switch the optical source in a single package. The device is interdisciplinary in nature, combining elements of optical, electrical, mechanical, and materials engineering to enable conventionally non-existent switch performance. Referring now to the drawings, and more particularly to FIGS. 1 through 8, where similar reference characters denote corresponding features consistently throughout, there are shown exemplary embodiments. In the drawings, the size and relative sizes of components, layers, and regions, etc. may be exaggerated for clarity.

Figure 1:
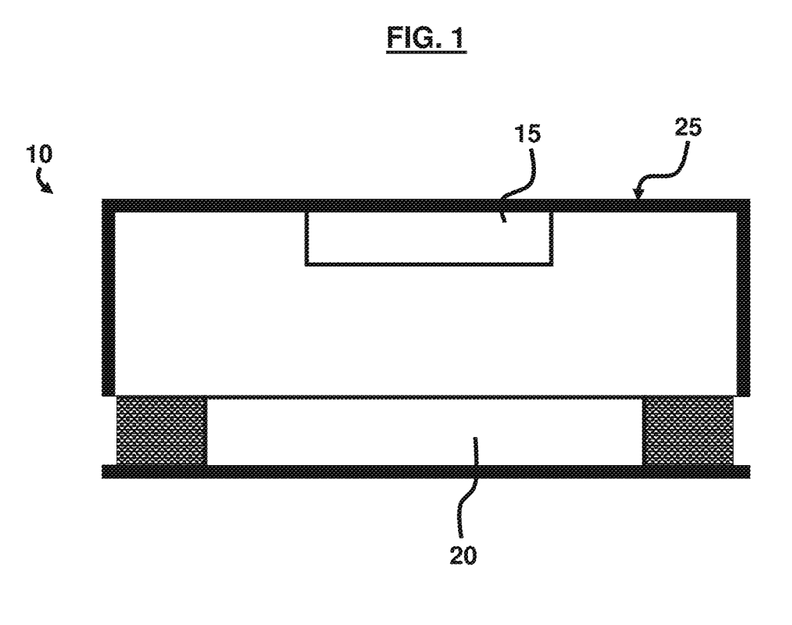
FIG. 1 is a schematic diagram illustrating a cross-sectional front view of a semiconductor device, according to an example.

FIG. 1 is a schematic diagram illustrating a semiconductor device 10 comprising an optical source 15. In an example, the optical source 15 may comprise any suitable device or mechanism that outputs light energy and which the intensity of the light energy can be controlled to be steady or variable and can be directed in one or more directions. The optical source 15 comprises internal circuitry (not shown) that converts an input electrical signal into an optical signal. The light energy of the optical signal may comprise any suitable wavelength, color, frequency, and intensity.

The semiconductor device 10 also includes a photoconductive switch 20 triggered by the optical source 15. The photoconductive switch 20 may be a high voltage and high current photoconductive switch 20 and may comprise semiconductor material such as gallium arsenide (GaAs), gallium nitride (GaN), aluminum nitride (AIN), chromium-doped gallium arsenide (Cr-GaAs), low-temperature grown gallium arsenide (LT-GaAs), indium phosphide (InP), or other suitable wide bandgap semiconductor material. The photoconductivity of the photoconductive switch 20 may be dependent on the type of semiconductor material(s) as well as other factors. The photoconductive switch 20 may be a metal-semiconductor-metal device and may be configured as a bulk device, small gap microstrip device, or a sliding contact device, according to some examples.

The semiconductor device 10 also includes an enclosure unit 25 that contains the optical source 15 and the photoconductive switch 20 in a single integrated package. In this regard, the enclosure unit 25 self-contains both the optical source 15 and the photoconductive switch 20 in a single integrated package without a division of two or more discrete units. Accordingly, both the optical source 15 and the photoconductive switch 20 are fully contained within the enclosure unit 25. As such, both the optical source 15 and the photoconductive switch 20 may each comprise any suitable size, shape, or configuration so long as they fit inside the enclosure unit 25. In this regard, the relative size of the optical source 15 compared to the photoconductive switch 20 is not limited to any particular ratio and accordingly the optical source 15 may be smaller, larger, or the same size as the photoconductive switch 20. Therefore, while the drawings depict the optical source 15 to be smaller than the photoconductive switch 20, this is for illustration purposes only and the embodiments herein are not restricted to any particular relative size of the illustrated components. The enclosure unit 25 may be a mechanical enclosure that is dimensioned and configured in any suitable size or shape to house the optical source 15 and the photoconductive switch 20. Moreover, the enclosure unit 25 may be composed of any type of material. In an example, the enclosure unit 25 may be conductive, which may help in to shield the semiconductor device 10, as a whole, from electromagnetic interference as well as helping the semiconductor device 10 to cool during or after use. In another example, the enclosure unit 25 may be non-conductive. In still another example, the enclosure unit 25 may comprise some portions that are conductive and other portions that are non-conductive. In yet another example, the enclosure unit 25 may be partially or fully insulated. The enclosure unit 25 may be substantially hollow to contain the optical source 15 and photoconductive switch 20 therein, or the enclosure unit 25 may contain other materials to fill voids or gaps in the enclosure unit 25. According to an example, the enclosure unit 25 may be ruggedized such that it is vibration-shock resistant. Furthermore, the enclosure unit 25 may have any suitable thickness, and the enclosure unit 25 may be lightweight and capable of being easily moved or transferred from one location to another. As such, the enclosure unit 25 may be constructed by 3D-printing, in an example.

Figure 2:
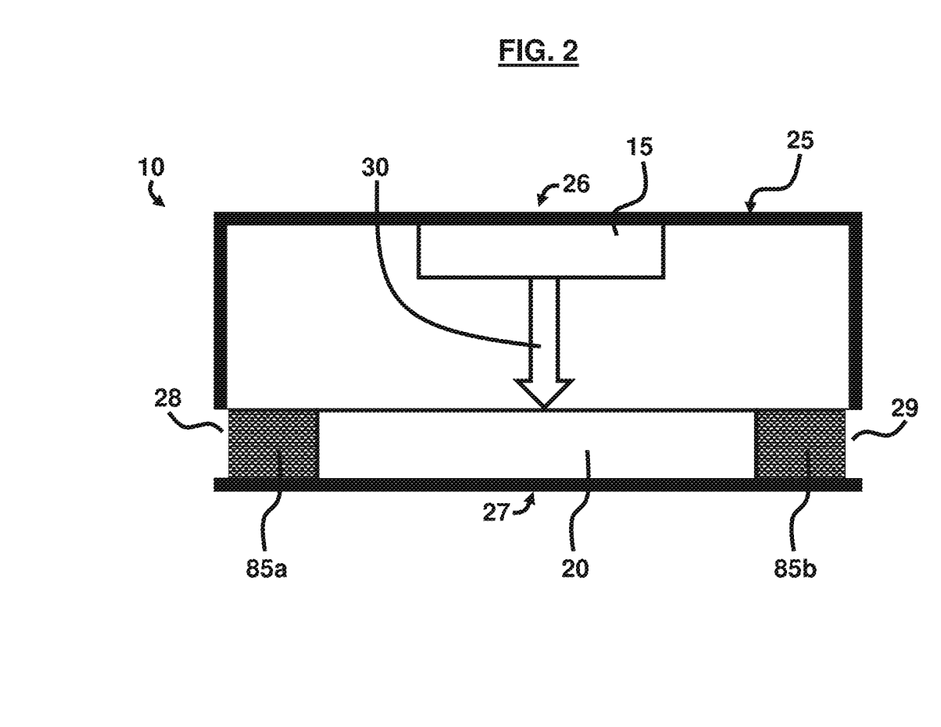
FIG. 2 is a schematic diagram illustrating a cross-sectional front view of the semiconductor device of FIG. 1 with an output laser, according to an example.

FIG. 2, with reference to FIG. 1, is a schematic diagram illustrating an example in which the optical source 15 may output a laser 30. In this regard, the optical source 15 may configured as a laser driver to output the laser 30. According to an example, the optical source 15 may be positioned at a first end 26 of the enclosure unit 25 and the photoconductive switch 20 may be positioned a second end 27 of the enclosure unit 25 that is opposite to the first end 26. In this regard, the optical source 15 is optically aligned with the photoconductive switch 20. Electrical pads 85a, 85b may be connected or integrated to the photoconductive switch 20 such that an electrical pad 85*a* may input power ($P_{in}$) and an electrical pad 85*b* may output power ($P_{out}$), among other electrical signals, with respect to the photoconductive switch 20. Accordingly, the electrical pads 85*a*, 85*b* are the +/− voltage terminals for the photoconductive switch 20 and are connected to another circuit (not shown). According to an example, and as illustrated in the drawings, the electrical pads 85*a*, 85*b* may be also self-contained in the enclosure unit 25 along with the optical source 15 and photoconductive switch 20 with external (i.e., external to the enclosure unit 25) access and/or further connection to other devices and components (not shown) to the electrical pads 85*a*, 85*b* provided. According to another example, electrical pads 85*a*, 85*b* may be fully or partially positioned to be external to the enclosure unit 25. The enclosure unit 25 may have openings 28, 29 where the electrical pads 85*a*, 85*b* extend from the enclosure unit 25 or are accessible from the enclosure unit 25.

Figure 3:
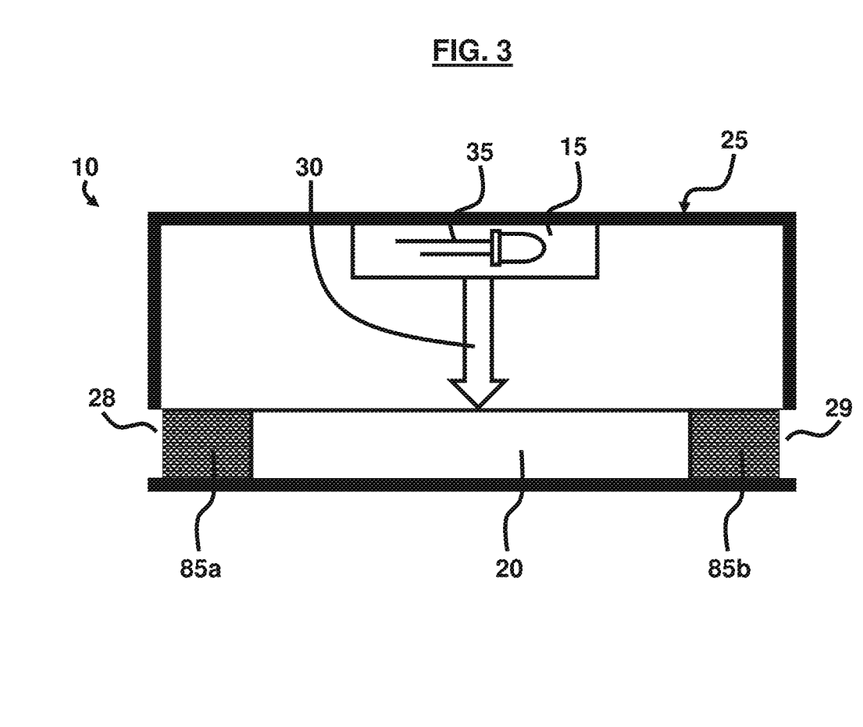
FIG. 3 is a schematic diagram illustrating a cross-sectional front view of the semiconductor device of FIG. 1 with a diode, according to an example.

FIG. 3, with reference to FIGS. 1 and 2, is a schematic diagram illustrating an example in which the optical source 15 may comprise a diode 35. In some examples, the diode 35 may comprise a light-emitting diode, organic light-emitting diode, or any other suitable type of light producing diode. In another example, the diode 35 comprises a laser diode that electrically pumps semiconductor lasers such that the diode 35 comprises a gain medium, output stage to collimate the beam, control stage, power stage, and frequency stage in order to output the laser 30. The laser 30 that is output may comprise any suitable emission wavelength required to activate the photoconductive switch 20. In an example, the emission wavelength of the laser 30 may be at least 720 nm. Additionally, the laser 30 may be tuned to alter the wavelength. If required, collimating lenses may be utilized to focus the laser 30 towards and onto the photoconductive switch 20. Furthermore, the laser 30 may be output in any type of mode of operation including continuous-wave operation or in pulses by switching the pump current.

Figure 4:
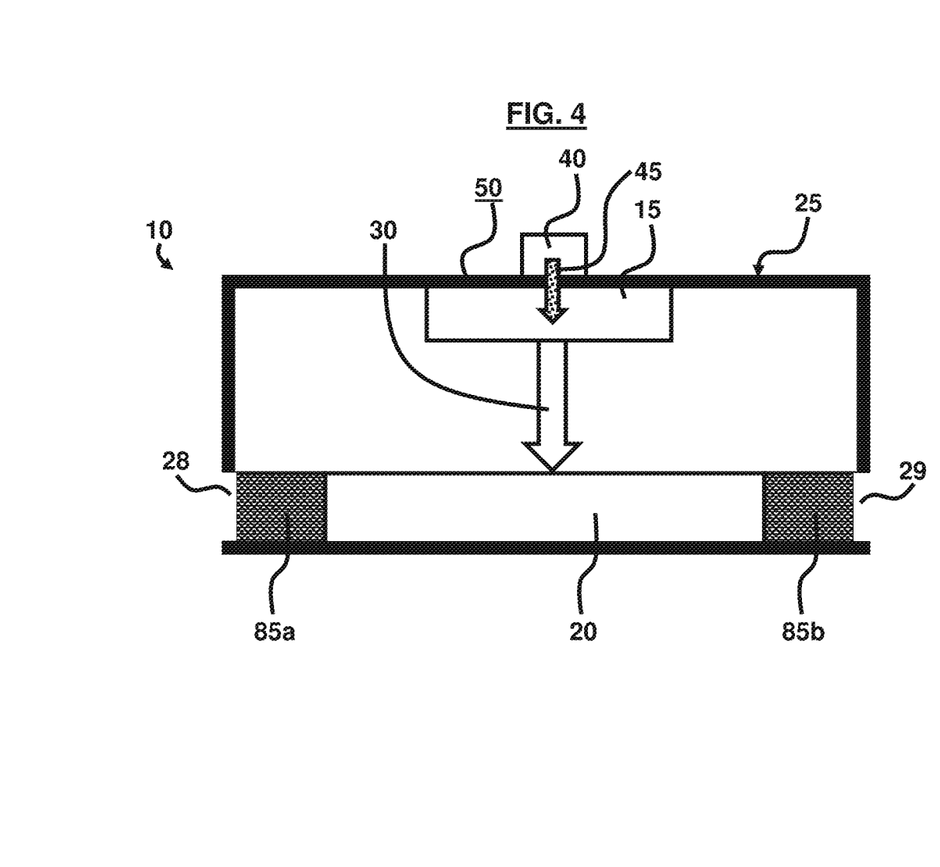
FIG. 4 is a schematic diagram illustrating a cross-sectional front view of the semiconductor device of FIG. 1 with an electrical connector, according to an example.

FIG. 4, with reference to FIGS. 1 through 3, is a schematic diagram illustrating an example in which the semiconductor device 10 may further comprise an electrical connector 40 operatively connected to the optical source 15. The electrical connector 40 may provide power and control signals 45 to the optical source 15. In an example, the electrical connector 40 may be attached to an outer surface 50 of the enclosure unit 25. The outer surface 50 of the enclosure unit 25 may comprise any suitable surface quality and consistency including smooth, rough, flat/planar, curved, indented, or raised, among others. The electrical connector 40 may be configured for AC or DC electrical capabilities for the optical source 15. Furthermore, the enclosure unit 25 may be configured for the electrical connector 40 to be integrated to outer surface 50 such that the electrical connector 40 is affixed to the enclosure unit 25 as a single discrete structure. In another example, the electrical connector 40 may be removably attached to the outer surface 50 of the enclosure unit 25. The electrical connector 40 is operatively connected to the optical source 15 through the enclosure unit 25 that that the enclosure unit 25 may comprise an opening (not shown) to permit a connection such as a wire from the electrical connector 40 through the enclosure unit 25 and to the optical source 15. According to some examples, the power and control signals 45 may be provided to the optical source 15 through the electrical connector 40 such that the power and control signals 45 may originate from a component (not shown in FIGS. 1 through 4) that provides power and control capabilities for operation of the optical source 15 including turning the optical source 15 on/off thereby eliminating the need to open the enclosure unit 25 in order to access the optical source 15 for operational control. This permits the enclosure unit 25 to remain in an enclosed state to isolate the output of the laser 30 and eliminate structural deficiencies in the enclosure unit 25, which may have otherwise been caused by a periodic opening/closing action of the enclosure unit 25. Furthermore, this also allows the optical source 15 and the photoconductive switch 20 to remain in optical alignment with each other, even after multiple uses of the semiconductor device 10 including movement or transfer of the enclosure unit 25 from one location to another.

Figure 5:
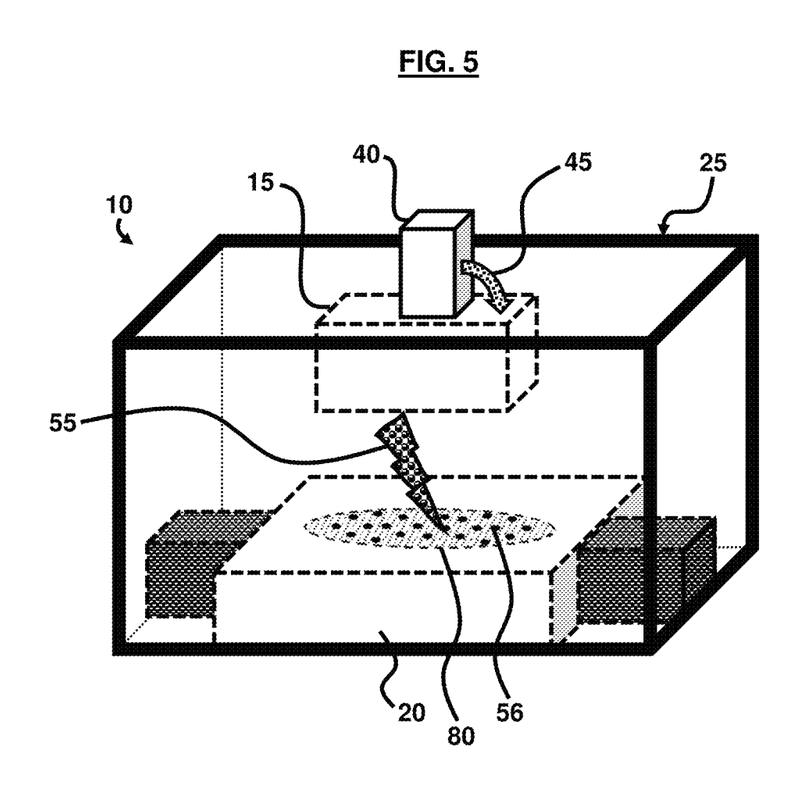
FIG. 5 is a schematic diagram illustrating a perspective view of the semiconductor device of FIG. 1, according to an example.

FIG. 5, with reference to FIGS. 1 through 4, is a schematic diagram illustrating the semiconductor device 10 comprising an optical source 15. The semiconductor device 10 also includes an electrical connector 40 to provide power and control signals 45 to the optical source 15. The semiconductor device 10 also includes a photoconductive switch 20 actuated by photons 55 directed by the optical source 15. In this regard, the optical source 15 may emit light containing the photons 55, which are directed towards and onto the photoconductive switch 20. The photoconductive switch 20 comprises semiconductor material 80. The mechanism of action is that the photons 55 from the optical source 15 hit electrons 56 in the valence bands of the semiconductor material 80, knocking the electrons 56 into the conduction band at which point the electrons 56 conduct electricity. The conduction continues until either no more photons 55 are knocking electrons 56 loose (linear mode), or until the electron-hole pairs recombine (non-linear mode). The semiconductor device 10 also includes an enclosure unit 25 that contains the optical source 15 and the photoconductive switch 20 in a single integrated package. The enclosure unit 25 is depicted as a substantially box-shaped device in the figures. However, this representation is for illustrative purposes only and the enclosure unit 25 is not restricted to any particular geometry or shape. Furthermore, the enclosure unit 25 may be transparent, translucent, opaque, or may be configured such that different portions of the enclosure unit 25 have different optical properties.

Figure 6:
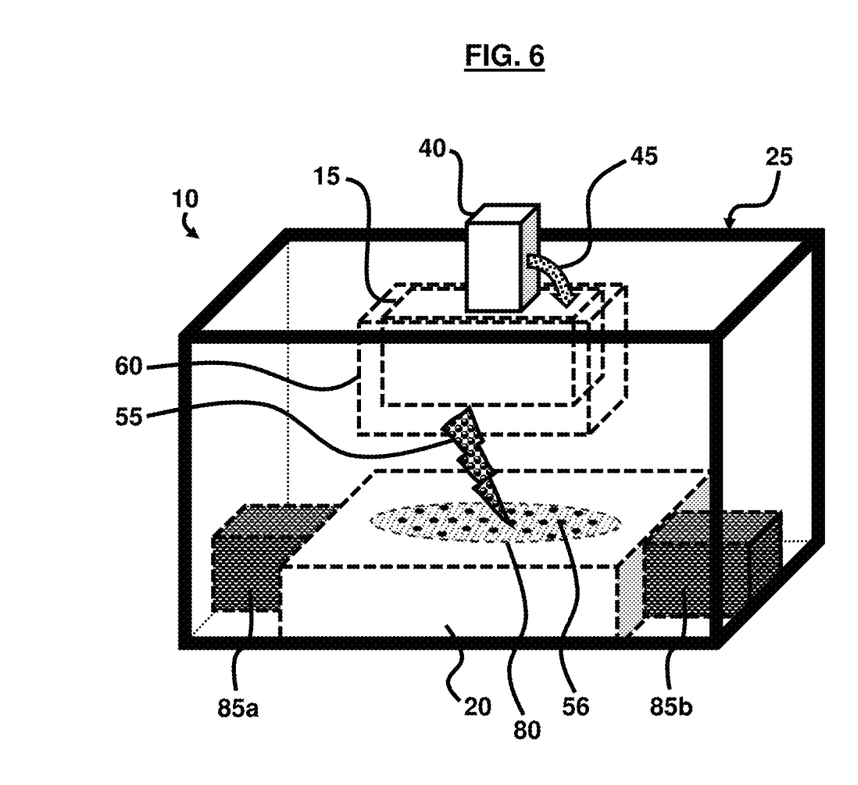
FIG. 6 is a schematic diagram illustrating a perspective view of the semiconductor device of FIG. 1 with a shielding component, according to an example.

FIG. 6, with reference to FIGS. 1 through 5, is a schematic diagram illustrating an example in which the semiconductor device 10 may further comprise a shielding component 60 that reduces electromagnetic capability (EMC) and/or electromagnetic interference (EMI) between the optical source 15 and the photoconductive switch 20. In an example, the shielding component 60 may comprise a conductive metal material including any of copper, silver, gold, and aluminum material. As an example, the shielding component 60 may be a covering (e.g., such as a Faraday cage, etc.) surrounding the optical source 15 with an aperture (not shown) to permit the photons 55 from the light to be emitted from the optical source 15 onto the photoconductive switch 20. In another example, the shielding component 60 may be a metallic screen positioned between the optical source 15 and the photoconductive switch 20. The shielding component 60 is configured to absorb and/or deflect electromagnetic signals or radio frequency signals directed towards the optical source 15 or photoconductive switch 20 or both before the signals interfere with the electronic circuitry (not shown) contained within the optical source 15 and/or photoconductive switch 20.

In an example, the photoconductive switch 20 may operate in any of a linear and non-linear mode of operation upon actuation by the optical source 15. According to an example, the linear or non-linear mode of operation may be dependent on the type of semiconductor material in the photoconductive switch 20 that receives the photons 55 from the optical source 15. For example, semiconductor materials such as GaAs, GaN, AN, Cr-GaAs, LT-GaAs, and InP, any of which may be suitable for use in the photoconductive switch 20, exhibit both linear and non-linear modes of operation. Accordingly, a variety of different types of configurations of the optical source 15 can be used, as described above, so long as the optical source 15 provides sufficient energy at the correct wavelength for a given material of the photoconductive switch 20 to operate at a desired mode of operation.

In another example, the photoconductive switch 20 may alternate between the linear and non-linear mode of operation by altering the number of photons 55 directed by the optical source 15. In this regard, the optical source 15 may be tuned to change the number of photons 55 that are emitted in the light onto the photoconductive switch 20. According to another example, the photoconductive switch 20 may conduct electricity upon actuation by the optical source 15 until a voltage level of the photoconductive switch 20 drops below a predetermined threshold voltage level. In some examples, the deviation from the predetermined threshold voltage may be a positive (i.e., higher) deviation or a negative (i.e., lower) deviation. Furthermore, the predetermined threshold voltage may be changed depending on the application using another component (not shown in FIGS. 5 and 6) or programmed into the circuitry (not shown) of the photoconductive switch 20. Moreover, the photoconductive switch 20 may conduct electricity upon actuation by the optical source 15 until the optical source 15 is turned off, according to an example.

Accordingly, the semiconductor device 10 may be used as a replacement for spark gap and conventional transistor switches in high-voltage applications. When it is desired that the semiconductor device 10 conduct current, a signal 45 to turn on the optical source 15 is transmitted from a component (not shown in FIGS. 5 and 6). When the photons 55 from the optical source 15 impact the photoconductive switch 20, the photoconductive switch 20 turns from an "off" state into a conductive "on" state. Depending on the mode of operation of the photoconductive switch 20, the photoconductive switch 20 will either conduct electricity until the voltage supplied to it drops below the predetermined threshold level, or the photoconductive switch 20 will stop conducting electricity when the optical source 15 is turned off.

Figure 7:
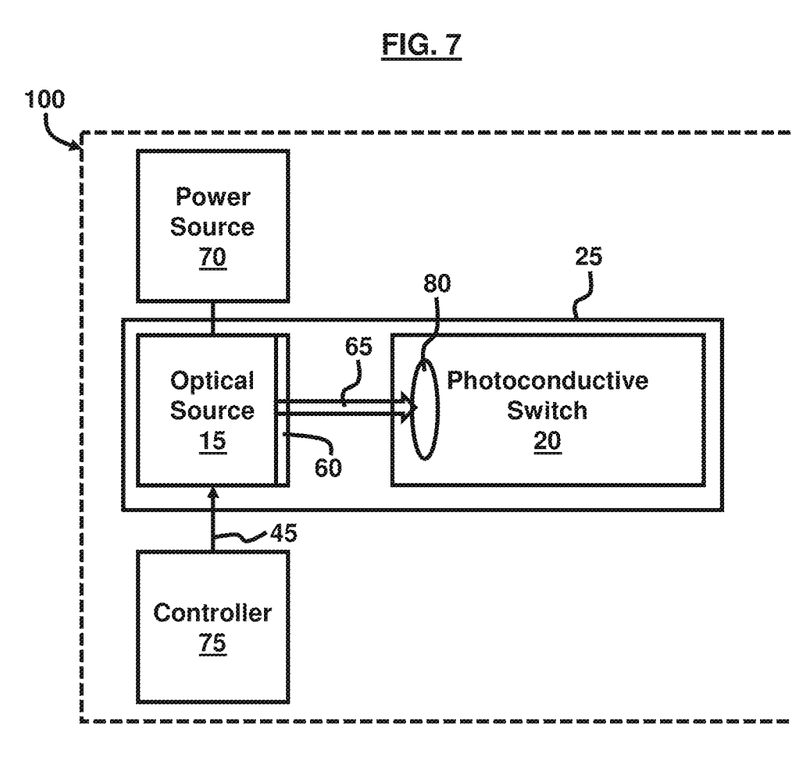
FIG. 7 is a block diagram illustrating a photonic system, according to an example.

FIG. 7, with reference to FIGS. 1 through 6, is a block diagram illustrating a photonic system 100 comprising an optical source 15 that generates a light beam 65. The photonic system 100 also includes a power source 70 that provides electrical power to the optical source 15. The power source 70 may provide AC or DC power capabilities to the optical source 15. The photonic system 100 also includes a controller 75 that sends control signals 45 to the optical source 15 to control transmission of the light beam 65. In an example, the controller 75 may be any type of processor, microcontroller, hardware engine, hardware pipeline, application specific processor, application specific integrated circuit, digital signal processor, firmware, software, one or more memory components including volatile and non-volatile memory components, and other suitable electronics for communicating with and controlling the optical source 15. Furthermore, the controller 75 may be programmable with computer-implemented instructions provided through the control signals 45 to instruct the optical source 15 to control transmission of the light beam 65.

The photonic system 100 also includes a photoconductive switch 20 optically aligned with the optical source 15. The light beam 65 may be set at any suitable energy level that is sufficient to cause actuation of the photoconductive switch 20. Accordingly, the photoconductive switch 20 may turn on and off based on the control signals 45 that control the light beam 65. In an example, the frequency of the photoconductive switch 20 turning on and off may be under one nanosecond. In another example, the frequency of the photoconductive switch 20 turning on and off may be between 5-10 nanoseconds.

Furthermore, other suitable frequencies for turning on/off the photoconductive switch 20 may be used in accordance with the embodiments herein, and the embodiments herein are not restricted to any particular frequency or range of frequencies.

Moreover, the energy level of the light beam 65 may be tuned for increased/decreased energy levels depending on the application and characteristics of the photoconductive switch 20 as well as the desired power output to be provided by the photoconductive switch 20. The photoconductive switch 20 comprises semiconductor material 80, such as GaAs, GaN, AN, Cr-GaAs, LT-GaAs, or InP, for example, that becomes optically triggered upon receiving the light beam 65 from the optical source 15. The photonic system 100 also includes a shielding component 60 that controls electromagnetic interference between the optical source 15 and the photoconductive switch 20. The photonic system 100 also includes an enclosure unit 25 that houses the optical source 15, the photoconductive switch 20, and the shielding component 60 in a single integrated package.

The distance between the optical source 15 and the photoconductive switch 20 can be appropriately selected depending on the voltage of the photoconductive switch 20 and how much of a concern electrical arcing is for a particular application. Depending on voltage levels of the photoconductive switch 20, the distance between the optical source 15 may range from approximately a 1 mm to 10 cm. As such, according to a non-limiting example, the distance between the optical source 15 and the photoconductive switch 20 may be approximately one millimeter. The proximity of the optical source 15 to the photoconductive switch 20 may generate a relatively high electromagnetic pulse (EMP) and cause a relatively high electromagnetic interference (EMI) between the optical source 15 and the photoconductive switch 20. Accordingly, positioning the optical source 15 and the photoconductive switch 20 within the same enclosure unit 25 is a significant deviation from conventional approaches in the industry. The embodiments herein overcome the challenges posed by the EMI by incorporating the shielding component 60 within the enclosure unit 25 as well.

Figure 8:
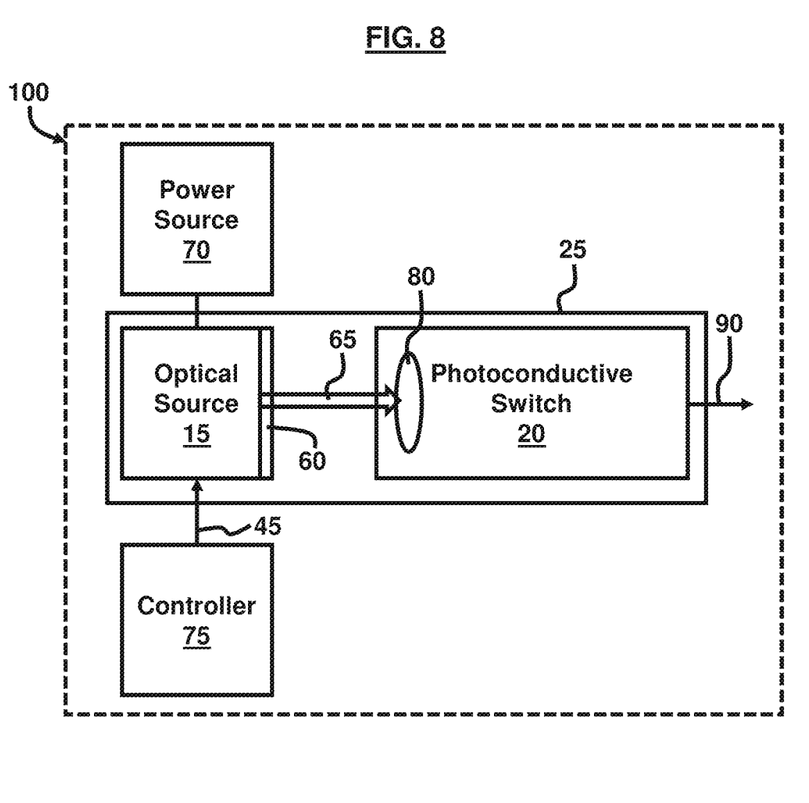
FIG. 8 is a block diagram illustrating the photonic system of FIG. 7 outputting an electromagnetic field, according to an example.

FIG. 8, with reference to FIGS. 1 through 7, is a block diagram illustrating an example in which the photoconductive switch 20 may output an electromagnetic field 90 upon the photoconductive switch 20 being optically triggered by the optical source 15.

Moreover, the shielding component 60 may provide protection for the electrical circuitry (not shown) contained in the optical source 15 from the radio frequency and/or electromagnetic pulse signals in the photonic system 100. As described above, the shielding component 60 is provided within the enclosure unit 25.

The semiconductor device 10 and photonic system 100 is a complete replacement for pulsed-power switches such as spark gaps and may be a replacement for high voltage transistor switches used in power converters. The embodiments herein reduce shot-to-shot jitter to the sub 1 nanosecond range and is at least an order of magnitude smaller than existing spark gap switches at equivalent power levels. Furthermore, the embodiments herein utilize an entirely different method of operation than existing pulsed-power switches, relying on an optical trigger (i.e., optical source 15 triggering the photoconductive switch 20 and both positioned in the same self-contained enclosure unit 25) rather than overcoming a voltage threshold. Moreover, according to some examples, the embodiments herein may be used in the directed energy, pulsed power, medical, and high energy physics fields. Additionally, the embodiments herein can also be used in electrical power conversion (AC/DC or DC/DC) and isolation. In other applications, the semiconductor device 10 and photonic system 100 can also be used to provide "hardening" to an electronic system, thereby reducing its electromagnetic susceptibility when used in place of a traditional transistor.

In conventional power electronic applications, the embodiments herein allow operations at frequencies, voltages, and current levels that traditional transistors cannot achieve. More specifically, by switching optically rather than electrically, and leveraging the bulk material properties of the photoconductive switch 20 and combining them in the same package (i.e., enclosure unit 25) as the optical trigger (i.e., optical source 15), the photoconductive switch 20 can be operated at frequencies, voltages, and currents far higher than traditional transistors, which reduces the size of the inductors required, and reduces the overall volume and weight of existing high-voltage DC/DC converters and isolators, which is desirable in small footprint applications and environments.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A semiconductor device comprising:
an optical source;
a photoconductive switch to conduct current when triggered by the optical source; and
an enclosure unit that contains the optical source and the photoconductive switch in a single integrated package.

2. The device of claim 1, wherein the optical source outputs a laser.

3. The device of claim 1, wherein the optical source comprises a diode.

4. The device of claim 1, wherein the enclosure unit is conductive.

5. The device of claim 1, wherein the enclosure unit is non-conductive.

6. The device of claim 1, comprising an electrical connector operatively connected to the optical source, wherein the electrical connector provides power and control signals to the optical source.

7. The device of claim 6, wherein the electrical connector is attached to an outer surface of the enclosure unit.

8. A semiconductor device comprising:
an optical source;
an electrical connector to provide power and control signals to the optical source;
a photoconductive switch actuated by photons to conduct current when directed by the optical source; and
an enclosure unit that contains the optical source and the photoconductive switch in a single integrated package.

9. The device of claim 8, comprising a shielding component that reduces electromagnetic interference between the optical source and the photoconductive switch.

10. The device of claim 9, wherein the shielding component comprises any of copper, silver, gold, and aluminum.

11. The device of claim 8, wherein the photoconductive switch operates in any of a linear and non-linear mode of operation upon actuation by the optical source.

12. The device of claim 11, wherein the photoconductive switch alternates between the linear and non-linear mode of operation by altering a number of the photons directed by the optical source.

13. The device of claim 8, wherein the photoconductive switch conducts electricity upon actuation by the optical source until a voltage level of the photoconductive switch drops below a threshold voltage level.

14. The device of claim 8, wherein the photoconductive switch conducts electricity upon actuation by the optical source until the optical source is turned off.

15. A photonic system comprising:
an optical source that generates a light beam;
a power source that provides electrical power to the optical source;
a controller that sends control signals to the optical source to control transmission of the light beam;
a photoconductive switch aligned with the optical source, wherein the photoconductive switch comprises semiconductor material that becomes optically triggered upon receiving the light beam from the optical source to conduct electricity;
a shielding component that controls electromagnetic interference between the optical source and the photoconductive switch; and
an enclosure unit that houses the optical source, the photoconductive switch, and the shielding component in a single integrated package.

16. The photonic system of claim 15, wherein a distance between the optical source and the photoconductive switch is approximately one millimeter.

17. The photonic system of claim 15, wherein the photoconductive switch turns on and off based on the control signals that control the light beam.

18. The photonic system of claim 17, wherein a frequency of the photoconductive switch turning on and off is under one nanosecond.

19. The photonic system of claim 15, wherein a frequency of the photoconductive switch turning on and off is between 5-10 nanoseconds.

20. The photonic system of claim 15, wherein the photoconductive switch outputs an electromagnetic field upon the photoconductive switch being optically triggered.

21. The device of claim 1, wherein a first electrical pad for input power and a second electrical pad for output power are connected to or integrated with the photoconductive switch.

22. The device of claim 1, wherein the frequency of the photoconductive switch turning on and off is not shorter than about 1/10 nanosecond.

23. The device of claim 1, wherein the frequency of the photoconductive switch turning on and off is not shorter than about 300 picoseconds.

24. The device of claim 8, wherein a first electrical pad for input power and a second electrical pad for output power are connected to or integrated with the photoconductive switch.

25. The device of claim 15, wherein a first electrical pad for input power and a second electrical pad for output power are connected to or integrated with the photoconductive switch.

\* \* \* \* \*